(12) United States Patent
Chou

(10) Patent No.: US 7,235,916 B2
(45) Date of Patent: Jun. 26, 2007

(54) PIEZOELECTRIC BLADES ANCHORING STRUCTURE

(75) Inventor: Chin-Wen Chou, Hsin Tien (TW)

(73) Assignee: Zippy Technology Corp., Taipei Hsien (TW)

( * ) Notice: Subject to any disclaimer, the term of this patent is extended or adjusted under 35 U.S.C. 154(b) by 160 days.

(21) Appl. No.: 10/859,183

(22) Filed: Jun. 3, 2004

(65) Prior Publication Data

US 2005/0269908 A1 Dec. 8, 2005

(51) Int. Cl.
*H01L 41/08* (2006.01)
(52) U.S. Cl. ...................... 310/355; 310/348
(58) Field of Classification Search ............... 310/340, 310/351–356, 328, 330–332, 348, 344
See application file for complete search history.

(56) References Cited

U.S. PATENT DOCUMENTS

| | | | | |
|---|---|---|---|---|
| 2,386,692 A | * | 10/1945 | Kuenstler | 310/340 |
| 3,679,919 A | * | 7/1972 | Ichinose et al. | 310/355 |
| 5,925,970 A | * | 7/1999 | Unami et al. | 310/328 |
| 6,307,305 B1 | * | 10/2001 | Yoshio et al. | 310/348 |
| 6,333,587 B1 | * | 12/2001 | Heinz et al. | 310/328 |
| 6,344,706 B1 | * | 2/2002 | Morita et al. | 310/340 |
| 6,448,690 B2 | * | 9/2002 | Sawai et al. | 310/320 |
| 6,507,139 B1 | * | 1/2003 | Ishino et al. | 310/348 |
| 6,709,285 B1 | * | 3/2004 | Chou et al. | 439/500 |

FOREIGN PATENT DOCUMENTS

TW 535999 6/2003

* cited by examiner

*Primary Examiner*—Mark Budd
(74) *Attorney, Agent, or Firm*—Birch, Stewart, Kolasch & Birch, LLP

(57) ABSTRACT

A piezoelectric blades anchoring structure includes an electric input leg which has a resilient end in contact with the piezoelectric blades in normal conditions and a connection end inserting in a circuit board. The resilient end is covered by a protection plate which also covers the electric contact of the piezoelectric blades and is bonded to the piezoelectric blades. The structure thus formed can prevent oxidation from taking place on the electric contact and the electric input leg, and protect the electric input leg from being damaged, and achieve improved electric connection between the piezoelectric blades and the circuit board.

5 Claims, 5 Drawing Sheets

PIEZOELECTRIC BLADES ANCHORING STRUCTURE

FIELD OF THE INVENTION

The present invention relates to a piezoelectric blades anchoring structure and particularly to an anchoring structure that has electric input legs to establish electric connection between piezoelectric blades and a circuit board to prevent oxidation and provide protection and improved electric connection.

BACKGROUND OF THE INVENTION

In order to improve the fabrication problems of connecting electric input ends of conventional piezoelectric blades by soldering and another technique which uses bent elastic reeds for connection that is easily breaking off, the applicant of the present invention has proposed an "Improved connection element for piezoelectric blades" which has been granted a R.O.C. patent by patent No. 535999. In that patent the connection element (electric input leg) has an elastic section connecting to a connection spot of the input end of the piezoelectric blades, and the elastic section has one end extended to form an anchor section fastened to a circuit board and another end extended towards the upper side of the piezoelectric blades to form a retaining section to confine the piezoelectric blades from being breaking off under vibration so that the piezoelectric blades may have an improved electric connection and breaking off caused by excessive vibration may be prevented.

However, due to manufacturers of the piezoelectric blades do not all adopt horizontal circuit boards, and some adopt vertical layouts. Hence some of the piezoelectric blades also have to be laid vertically. In such circumstances, the weight of the piezoelectric blades falls onto the electric input legs of one side. When subject to vibration for a period of time, the electric input legs born the weight tends to skew and bend, and results in loss of contact with the piezoelectric blades and affects electric connection.

Moreover, the electric contact of the piezoelectric blades to connect the electric input leg is a silver point, while the electric input leg is usually made of copper. Both of them tend to oxidize after having exposed to moisture. This also affects the electric connection. When the piezoelectric blades and the circuit board are assembled, they generally are stacked for transportation. As they are not the final products, they usually are not fully packaged. Hence during transportation, the circuit boards on the upper layers often drag the electric input legs of the piezoelectric blades on the lower layers and results in bending of the electric input legs and makes electric connection not possible.

SUMMARY OF THE INVENTION

The primary object of the present invention is to solve the disadvantages mentioned above. The invention provides a connection structure to improve the connection of the piezoelectric blades and the electric input leg, and protect the electric input leg from being damaged by external forces, and prevent oxidation from occurring. The invention includes an electric input leg that has a resilient end to maintain constant contact with the piezoelectric blades and a connection end to insert into a circuit board. The resilient end is coupled with a protection plate which covers the resilient end and the electric contact of the piezoelectric blades and is bonded to the piezoelectric blades. Thereby the electric contact and the electric input leg may be prevented from oxidizing, and damage may be avoided and an improved electric connection between the piezoelectric blades and the circuit board may be achieved.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
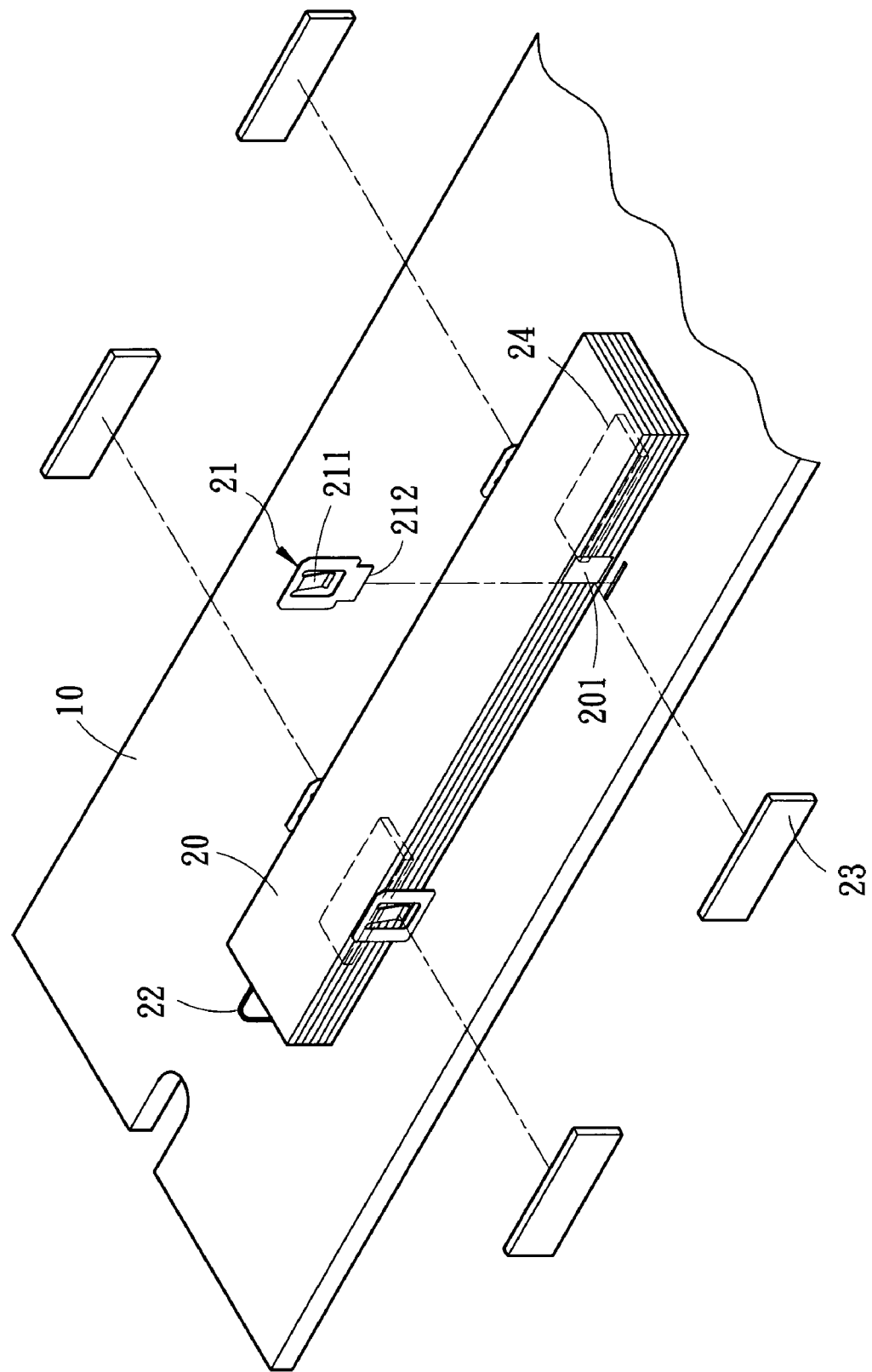
FIG. 1 is a schematic view of a first embodiment of the present invention.
Figure 2:
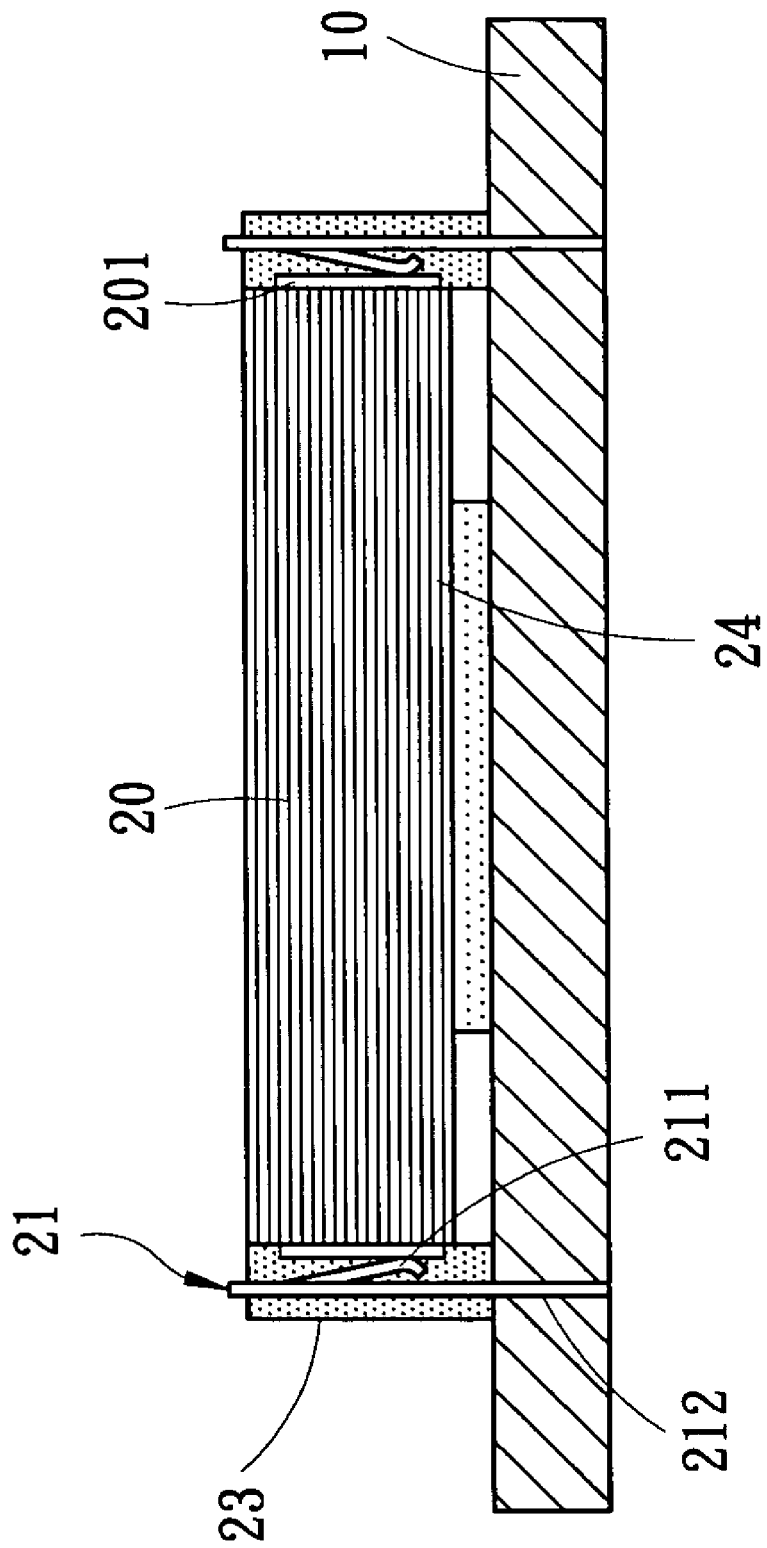
FIG. 2 is a sectional view of the first embodiment of the invention.

Please refer to FIGS. 1 and 2 for a first embodiment of a connection structure for piezoelectric blades 20 of the present invention. The piezoelectric blades 20 are located on a circuit board 10 interposed by an elastic member 24. The piezoelectric blades 20 have electric contacts 201 to connect to an electric input leg 21 (low voltage end) and an electric output leg 22 (high voltage end) to establish electric connection. The electric input leg 21 includes a resilient end 211 which is in contact with the piezoelectric blades 20 in normal conditions and a connection end 212 for inserting in the circuit board 10. A protection plate 23 is provided to cover a resilient end 211 and the electric contact 201 and is bonded to the piezoelectric blades 20.

Referring to FIG. 2, the protection plate 23 fully covers the resilient end 211 of the electric input leg 21 and the electric contact 201 of the piezoelectric blades 20. The protection plate 23 is made from pliable rubber and does not affect the vibration of the piezoelectric blades 20 and the connection conditions of the resilient end 211 in normal conditions. It also isolates the resilient end 211 and the electric contact 201 from the external air, thus can prevent oxidation from taking place. Moreover, due to the isolation of the protection plate 23, the electric input leg 21 may be prevented from direct contact of external forces, and damage may be avoided. It also protects users from electric shock. In practice the connection structure may be located on another end of the piezoelectric blades 20 of equivalent position, namely where vibration occurs, so that the piezoelectric blades 20 may have auxiliary support on multiple locations to maintain balanced vibration.

Figure 3:
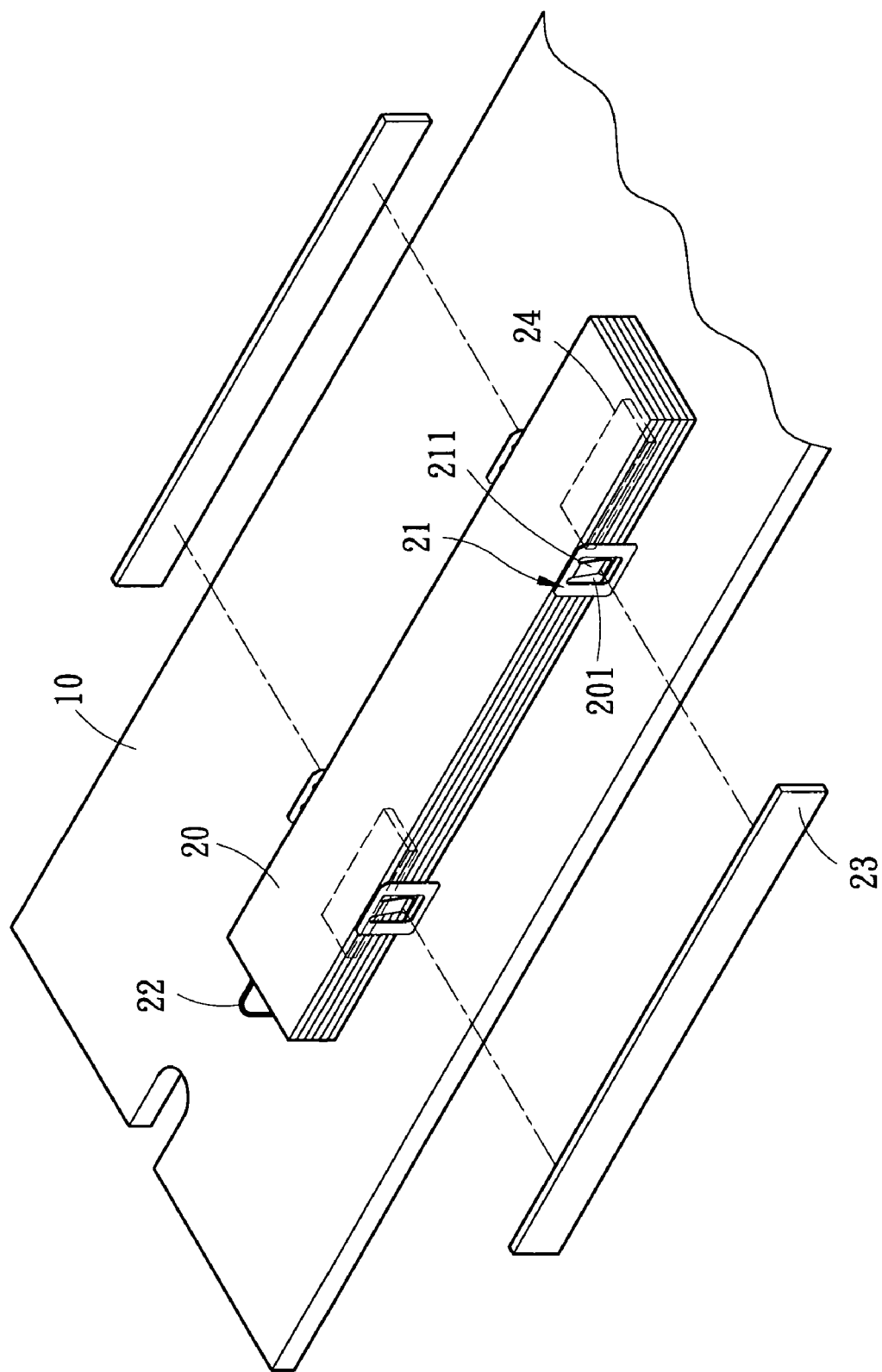
FIG. 3 is a schematic view of a second embodiment of the invention.

Refer to FIG. 3 for a second embodiment of the invention. It differs from the first embodiment by increasing the coverage range of the protection plate 23 to currently cover electric input legs 21 located on two ends of the piezoelectric blades 20. It can achieve the same effect as previously discussed.

Figure 4:
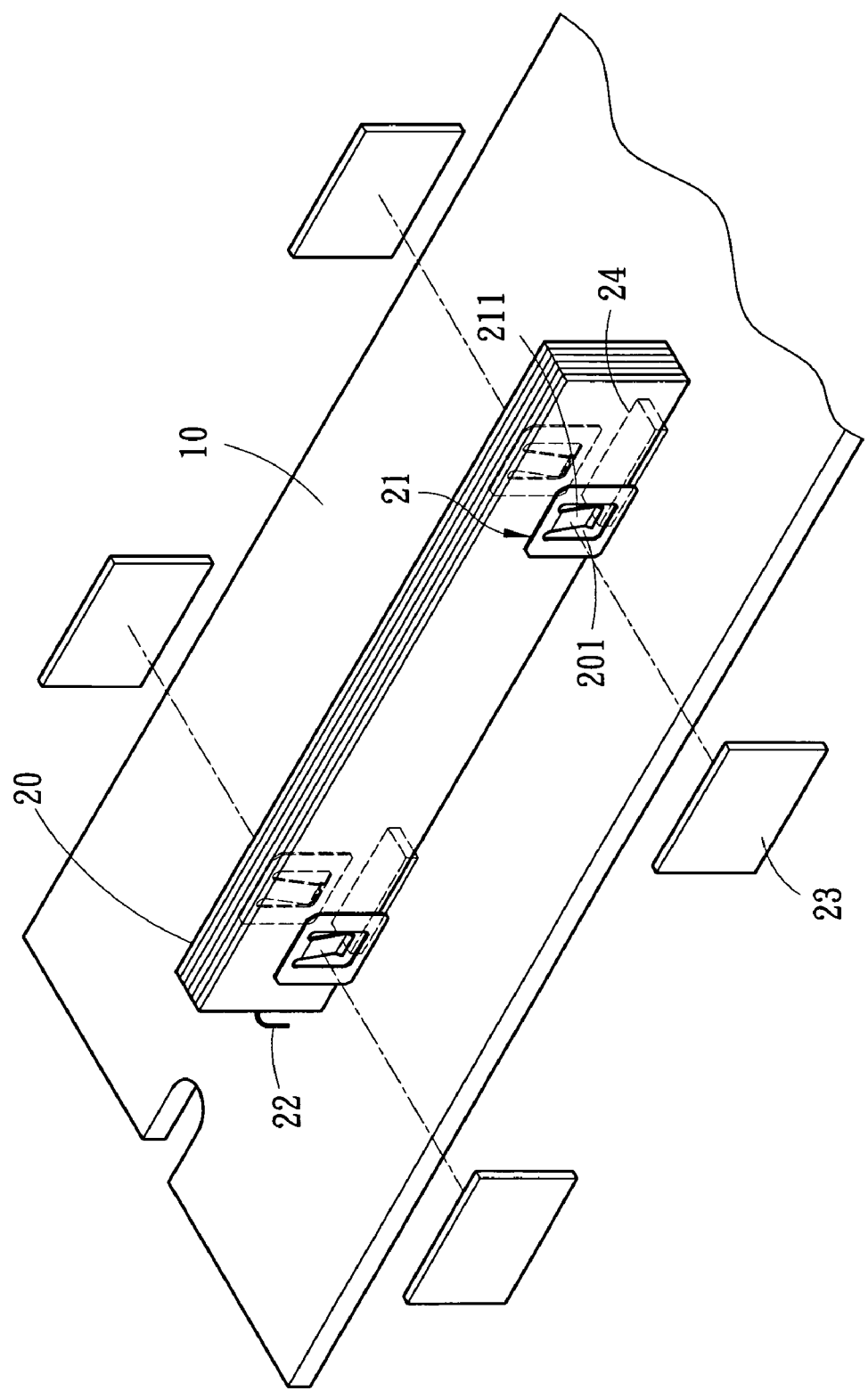
FIG. 4 is a schematic view of a third embodiment of the invention.

Refer to FIG. 4 for a third embodiment of the invention. It differs from the previous embodiments by having the piezoelectric blades 20 resting vertically on the circuit board 10 for electric connection. The locations of the electric contact 201 alter. However, the invention can also be applied to the electric input leg 21 and the piezoelectric blades 20, and provide covering of the protection plate 23 for protection.

Figure 5:
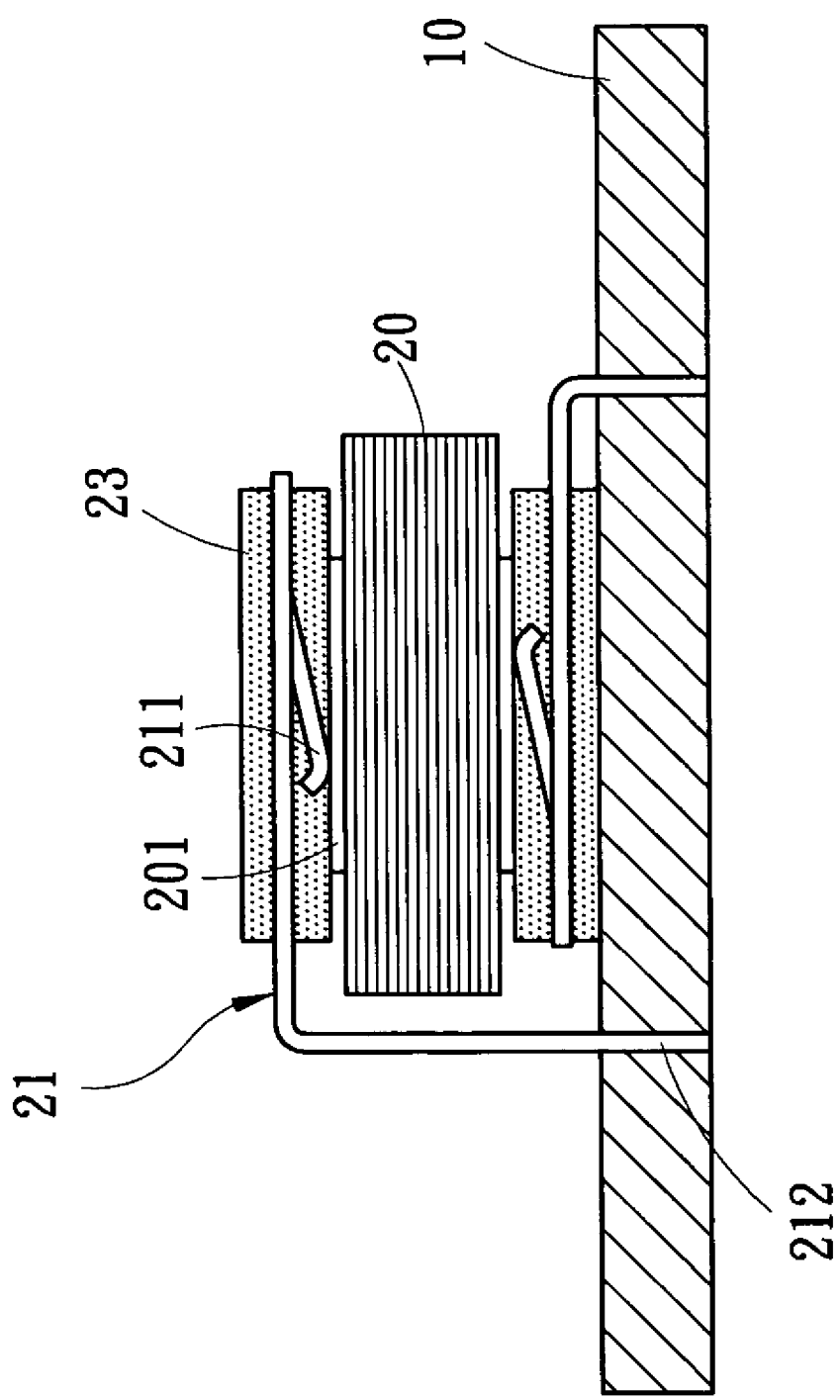
FIG. 5 is a sectional view of a fourth embodiment of the invention.

Refer to FIG. 5 for a fourth embodiment of the invention. It differs from the previously embodiments by having the piezoelectric blades 20 laid transversely on the circuit board 10 for electric connection, while the electric contacts 201 are altered and located on an upper and a lower surface of the piezoelectric blades 20 on preset locations. The invention can also be applied to the electric input leg 21 and the piezoelectric blades 20, and provide covering of the protection plate 23 for protection. Moreover, the elastic member 24 may be replaced by the protection plate 23. And the piezoelectric blades 20 can generate vibrations up and down with an improved effect.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A piezoelectric blades anchoring structure comprising an electric input leg and an electric output leg to anchor a stack of piezoelectric blades that have electric contacts onto a circuit board and establish electric connection with the circuit board by connecting the electric input leg and the electric output leg to the electric contacts;

wherein the electric input leg includes a resilient end in contact with the piezoelectric blades in normal conditions and a connection end inserting in the circuit board, the resilient end being covered by a protection plate which also covers the electric contact and is bonded to only a part of the stack of piezoelectric blades.

2. The piezoelectric blades anchoring structure of claim 1, wherein the protection plate is made from pliable rubber.

3. The piezoelectric blades anchoring structure of claim 1, wherein the resilient end of the input leg has in inside surface facing the stack of piezoelectric blades and an outside surface, the protection plate covering the outside surface of the resilient end.

4. The piezoelectric blades anchoring structure of claim 3, wherein the protection plate completely encloses a majority of the resilient end of the input leg.

5. The piezoelectric blades anchoring structure of claim 1, wherein the protection plate completely encloses a majority of the resilient end of the input leg.

* * * * *